United States Patent [19]

Chinn

[11] Patent Number: 5,414,344
[45] Date of Patent: May 9, 1995

[54] NON-CONTACT APPARATUS FOR SENSING ENERGIZATION OF HIGH VOLTAGE SIGNAL LINE

[76] Inventor: Robert S. Chinn, 119 - 10th Ave. S., No. 507, Seattle, Wash. 98104

[21] Appl. No.: 101,374

[22] Filed: Aug. 3, 1993

[51] Int. Cl.⁶ .................. G01R 31/02; H02H 3/00
[52] U.S. Cl. ................... 324/72; 324/522; 324/543; 324/715; 361/59; 361/92
[58] Field of Search .......... 324/522, 543, 555, 705, 324/713, 715, 718, 72, 72.5; 361/59, 60, 92

[56] References Cited

U.S. PATENT DOCUMENTS

| | | | |
|---|---|---|---|
| 4,241,373 | 12/1980 | Mara et al. | 324/133 X |
| 4,855,671 | 8/1989 | Fernandes | 324/127 |
| 4,980,790 | 12/1990 | Thibodeau | 361/59 X |
| 5,144,227 | 9/1992 | Shaw | 324/149 |
| 5,237,480 | 8/1993 | Dara | 361/92 X |

Primary Examiner—Kenneth A. Wieder
Assistant Examiner—Glenn W. Brown
Attorney, Agent, or Firm—Michael J. Folise

[57] ABSTRACT

An E-field sensing apparatus detects the energization of high voltage utility transmission and distribution lines. An external housing substantially shields internal components of the apparatus from the detected E-field. A conductive wire extends from the housing where it is exposed to the E-field. A signal is induced onto the exposed wire and sensed by the apparatus. The length of exposed wire and the distance of the apparatus from the high voltage line attenuate the E-field so the induced signal is within operational parameters of internal sensing components. Adjustments to the wire length and apparatus distance enable detection of E-fields surrounding power lines carrying voltage levels of a predetermined voltage level (i.e. approximately 2000 volts and higher). In response to the E-field the apparatus generates an analog output signal and a line isolation control (one-bit digital) signal. The analog output signal drives a meter, LED or other indicating device serving to aid maintenance engineers. The analog output also provides data to a SCADA or other control/indication system. The control signal drives a relay to a normally open position or trips the relay closed when the line power fails. The control drives motors to either maintain or isolate (shut down) power lines at a power substation.

8 Claims, 2 Drawing Sheets

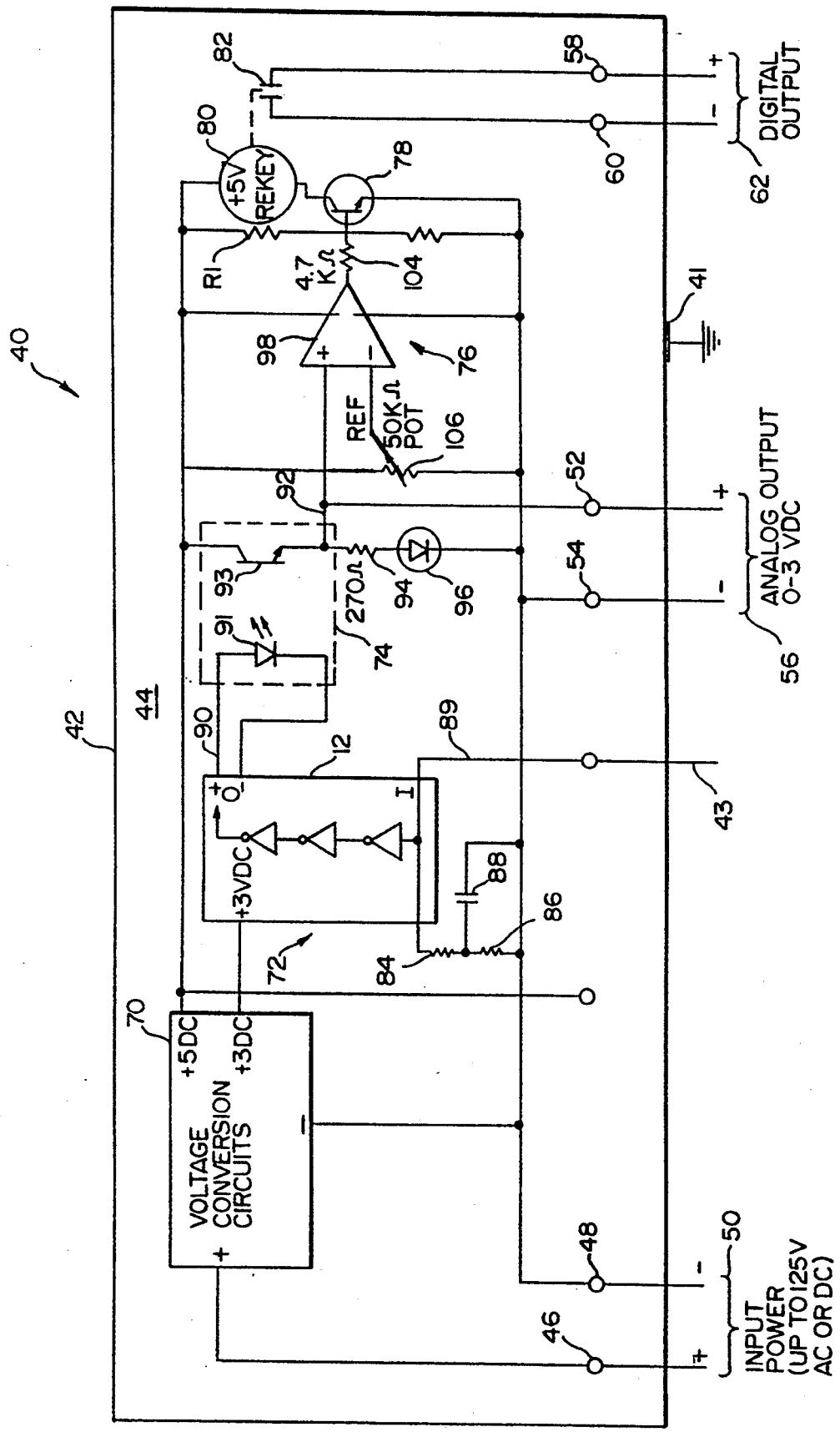

NON-CONTACT APPARATUS FOR SENSING ENERGIZATION OF HIGH VOLTAGE SIGNAL LINE

BACKGROUND OF THE INVENTION

This invention relates to an apparatus that detects energization of high voltage lines (i.e., 2000 volts and higher) without direct connection (i.e., non-contact) to such lines. More particularly, this apparatus relates to an apparatus that detects the electric field (i.e., E-field) surrounding high voltage transmission and distribution lines used for electrical utility power distribution.

Electrical utilities need to monitor their power lines to determine when lines are down or in need of repair, and when power transmission to specific areas needs to be re-routed. Transmission lines route high voltage electrical power from power plants to main regional stations and local substations. Distribution lines route high voltage electrical power from substations to end users. In many areas such lines are above ground exposed to natural elements. Thus, high winds, falling trees or other forces occurring during storms or natural disasters may de-energize or "knock out" a line.

Some electrical utility companies employ Supervisory Controls and Data Acquisition (SCADA) systems with automatic sectionalizing procedures to sense the activities of their power lines and react automatically to line failures. Typically, substations have incoming and outgoing high voltage transmission lines which feed transformers that step down the voltage a lower voltage (i.e., 12 kV) for distribution to end user residences and businesses. Previously, when a power line is knocked down, a coupled voltage transformer (CVT) typically senses the loss of voltage. The CVT has a primary winding connected directly to the 115 kV line and a secondary winding driving a relay to a normally open position. When the line is knocked down, the signal across the primary winding is discontinued causing the signal on the secondary winding to discontinue. The loss of signal on the secondary winding closes the relay, starting a motor that opens switches on all de-energized 115 kV lines at the substation.

The electrical utility monitors the CVT signals via remote communication within the SCADA systems to determine which lines in a region are active. A failed power line is bypassed, when possible, and power re-routed through other lines. The CVT devices are expensive devices directly connected to power lines. The power lines need to be shut down, when possible, to install and replace such devices. Accordingly, there is a need for a non-intrusive monitoring device which monitors power lines and is linked to SCADA systems.

A non-intrusive way of detecting the presence of electrical signals is to detect the E-field surrounding the lines carrying the signal. There are E-field detectors known for detecting low voltage (i.e. 440 volts or less) activity. FIG. 1 shows one such low voltage sensor device manufactured by Radio Shack under the Micronta ® trademark. The sensor device 10 includes a set of serially connected hex inverters 12 (MC 14069 UBCP) receiving an induced input signal 14. The sensor device 10 is activated by pressing switch 16. The switch passes a 3 V dc power signal to the inverters 12. When the switch 16 is depressed and an input signal above a minimum input sensitivity voltage is received, the input signal voltage is amplified to drive transistor 17 which in turn drives photodiode 18. When the input is above the minimum sensitivity the photodiode stays lit. The greater the input signal voltage, the brighter the photodiode 18 output up until a point at which the driving transistor 17 saturates. Voltage limiting circuitry including resistors 20, 22, 24, 26 and capacitor 28 protect the inverters 12 from voltage input signals above a specific value.

The prior art voltage sensor of FIG. 1 and other low voltage sensors over-saturate in the presence of high voltage signals (such as the approximately 2000 volts or higher contemplated by this invention). The sensor of FIG. 1 also has a poor response to voltage transients when over-saturated. Accordingly, there is a need for a non-contact apparatus which can detect the E-field of high voltage (i.e., 2000 volts or higher) signals without over-saturating and which can respond quickly enough to sense voltage transients.

SUMMARY OF THE INVENTION

According to the invention, a non-contact apparatus for detecting the presence of an electric field surrounding a high voltage signal line is provided. According to one aspect of the invention, the apparatus includes an external housing which is substantially shielded from the E-field. A conductive wire protrudes from the housing where it is exposed to the E-field. The length of wire exposed to the E-field (plus the degree of shielding and the distance of the apparatus from the high voltage line) attenuate the E-field, preventing internal circuitry from over-saturating in the presence of high E-fields. Attenuating the E-field by adjusting the wire length and apparatus distance enables detection of E-fields for voltage levels of approximately 2000 volts and higher while maintaining sensitivity to transients.

According to another aspect of the invention, the apparatus provides an analog output signal which drives a meter, LED or other indicating device. The analog output and indicating device aid maintenance engineers working at a substation or near a power line by indicating when a line is "hot" (i.e., carrying a high voltage signal). The analog output in one embodiment is fed to SCADA equipment for monitoring.

According to another aspect of the invention, the analog output is converted to digital format for line isolation control. In one embodiment the analog signal is fed to a receiver which converts the signal to digital format. The digital signal is processed in software to compare to a reference voltage indicative of whether the power line emitting the E-field is energized. In another embodiment, the analog signal is coupled to a comparator. The comparator also receives a programmable reference voltage. A comparator output signal is coupled to a relay and motor. When the sensed E-field induces a signal on the external conductor to a voltage less than a selectable threshold voltage (i.e., power line failure), the digital signal (output from the comparator or receiver) triggers a relay causing a motor to open a switch on the line (i.e., perform line isolation at the substation).

An advantage of this invention includes the non-contact detection of line signals. As a result, power service need not be disrupted during installation or repair of the apparatus. Another advantage is the directional sensing of the apparatus which enables detection of a specific line among several power lines at a substation.

These and other aspects and advantages of the invention are provided by an apparatus, including internal sensing circuitry shielded within a metal box. A partially exposed insulated conductor protrudes from the box. A voltage signal is induced upon the conductor when surrounded by an electric field. The box shielding, length of cable exposed and the distance from a high voltage line (i.e., field strength at the box) tune the apparatus to sense energization of high voltage lines of approximately 2000 volts or higher. The internal circuitry in one embodiment includes amplifying circuits which drive an optical isolator. An analog output of 0-3 V dc is taken off the optical isolator. The isolator output signal also is fed into a comparator. When the isolator signal goes below a specified reference voltage, a switching transistor turns off closing a relay. When the isolator signal exceeds the specified reference voltage, the switching transistor is driven on keeping the relay open. When the relay closes, power line de-energization is indicated.

The invention will be better understood by reference to the following detailed description taken in conjunction with the accompanying drawings.

BRIEF DESCRIPTION OF THE DRAWINGS

FIG. 2 is a schematic diagram of an apparatus for detecting energization of a high voltage signal line according to an embodiment of this invention.

DESCRIPTION OF SPECIFIC EMBODIMENTS

Overview

Figure 1:
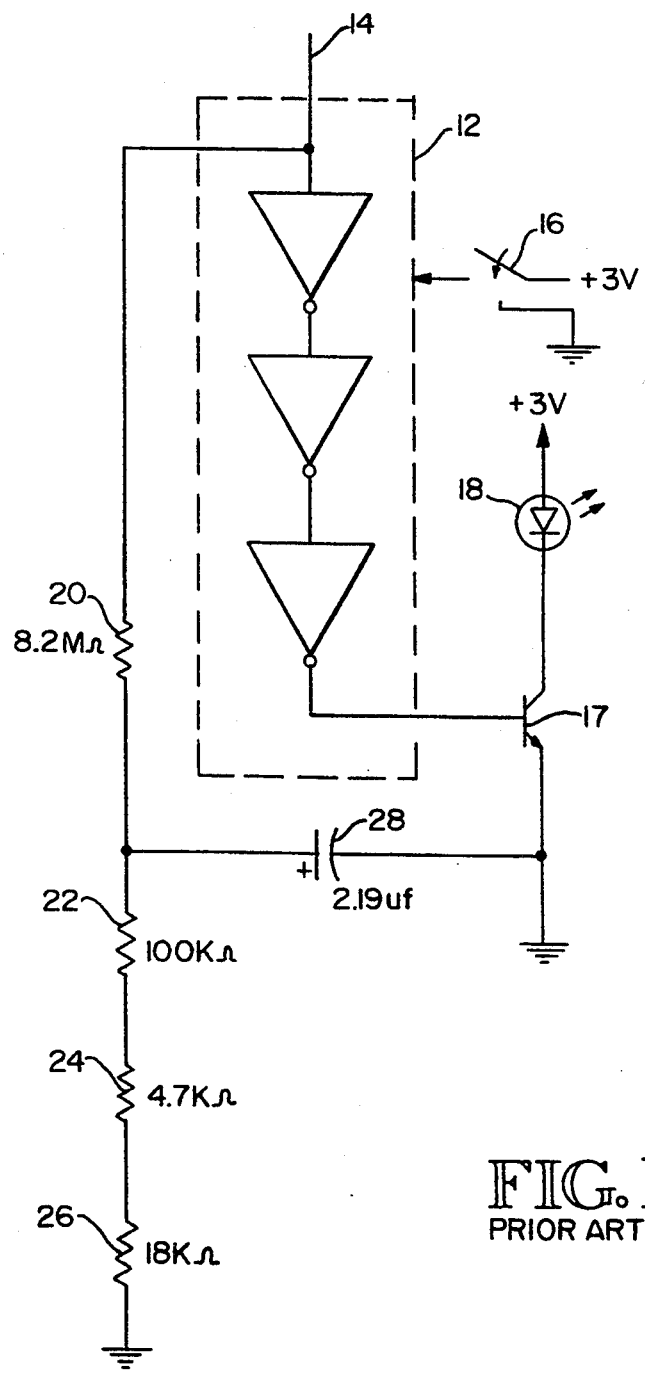
FIG. 1 is a schematic diagram of a prior art low voltage sensor device.

FIG. 2 shows a schematic diagram of the detecting apparatus 40 according to one embodiment of the invention. The apparatus 40 detects energization of a high voltage signal line without physical contact with the signal line. More specifically, the apparatus 40 senses an electric field surrounding the high voltage signal line. In one application the apparatus is used at electrical utility substations to sense whether power lines (i.e., high voltage lines) are "hot". When a power line is energized beyond a specific high voltage level (e.g., 2000 volts), the apparatus keeps a relay energized (open). When the signal line voltage drops below such specified level, the detection apparatus de-energizes (closes) the relay. When the relay is open, power service along distribution and transmission lines is enabled. When the relay is closed, power service along transmission and distribution lines at a substation is isolated.

In the power substation application, when a power line fails, the detection apparatus senses the loss of energization. In response, an output relay is closed triggering a motor to open a switch that isolates the lines at the substation. Once the failed line is repaired, it is brought back on-line. While isolated, power typically is rerouted around the isolated line to limit the power disruption, whenever possible.

The detection apparatus 40 includes a box 42 which houses internal electronic circuits 44.

Box 42

The box 42 is made of metal or another conductive material serving to shield the internal circuitry 44 from external electric fields. Shielding is accomplished by grounding the conductive box 42 at connection 41. A partially exposed insulated wire 43 protrudes from the box 42 so as to receive an induced signal from an external electric field. The induced signal serves as the input signal to internal circuitry 44. The apparatus 40 and box 42 also include input power connections 46, 48 for receiving a power source 50. Preferably the power source provides up to 125 volts at alternating current (ac) or direct current (dc) to the internal circuitry 44. Analog output connections 52, 54 provide an analog output signal 56 between 0 and 3 volts dc proportional to the strength of the sensed electric field. Digital output connections 58, 60 provide a digital output signal 62 corresponding to a logic high or logic low.

In the preferred embodiment, the box 42 is shielded on all sides with the insulated wire (sensor) 43 protruding from one side. Electric fields are sensed at the side having the wire 43 exposed, the body of the box 42 being a shield against other E-field sources. The arrangement makes the apparatus 40 sensitivity generally unidirectional. A box 42 is positioned in the vicinity of each power line at a substation. The unidirectional characteristic enables a given apparatus 40 to sense the electric field of a given power line without sensitivity corruption from other power lines.

The sensitivity of the apparatus 40 is altered by changing the relative position of the box (i.e., distance from line and face with exposed sensor wire). The sensitivity also may be adjusted by varying the length of exposed portion of the sensor wire 43. Specifically, by exposing more of the sensing conductor, the apparatus 40 becomes more sensitive to adjacent E-fields.

Internal Circuitry 44

The internal circuitry 44 senses the induced voltage signal of the coaxial cable 43 and generates an analog and a digital output. The analog output corresponds to the intensity of the sensed E-field. The digital output is a one digit logic high or logic low value identifying whether the analog output voltage level is less than or greater than an adjustable reference voltage level.

The internal circuitry 44 includes power source voltage conversion circuit 70, voltage sensing circuit 72, an optical isolator 74, a voltage comparator 76, switching transistor 78, relay 80 and output contact 82. Voltage conversion circuit 70 receives a power supply of up to approximately 125 volts (ac or dc). The power supply is converted to 5 volt dc and 3 volt dc voltage sources for use by the remaining internal circuits 44.

The voltage sensing circuit 72 includes amplifying and limiting circuits. In one embodiment, the circuit 72 includes a set of hex inverting amplifiers 12 (i.e., MC 14069 UBCP), along with limiting resistors 84, 86 and capacitor 88 as shown in FIG. 1. A 3 volt dc signal powers the inverters 12 to amplify an input signal 89 received from the sensor wire 43. The amplified signal 90 drives a photodiode 91 within an optical isolator 74 (e.g., TIL 157/698). A photodetector 93 senses the light emitted from the photodiode 91 to generate isolator output signal 92. The output signal 92 serves as the apparatus 40 analog output signal 56.

The photodetector 93 is sourced by a 5 v dc supply signal and isolated from ground with a protection resistor 94 and indicator photodiode 96. The analog output varies from ground to a 3 volt dc voltage magnitude.

Comparator circuit 76 receives the isolator output signal 92 at a non-inverting input of op amp 98. The op amp 98, along with biasing resistor 104 form the comparator circuit 76. A reference voltage signal REF is received at an inverting input of the op amp 98. The reference voltage signal REF is defined during calibration by adjusting potentiometer 106. Adjusting the potentiometer 106 defines a voltage level between 0–5 v dc. When the isolator output signal 92 exceeds the reference magnitude, the comparator circuit 76 drives a switching transistor 78 on. When the isolator output signal 92 is less than the reference magnitude, the comparator circuit 76 drives the switching transistor 78 off.

In one embodiment switching transistor 78 is an NPN transistor. The switching transistor 78 is coupled to relay 80. In one embodiment the relay 80 is normally closed. When the comparator circuit 76 fires, the transistor 78 switches on opening the relay. In the power line application, the normal condition is to sense line energization, drive the switching transistor 78 on, and thus drive the relay 80 open. When power line energization fails, the comparator 76 goes low driving the switching transistor 78 off and the relay 80 closed.

Relay 80 is a 5 volt relay. When energized (open), the open contact 82 delivers a logic high output signal 62, indicating the monitored power line is energized. Referring to FIG. 2, R1 and R2 are biasing resistors for switching transistor 78 and have resistance values selected based on the resistance of relay 80.

Operation

In operation the apparatus 40 is positioned adjacent to a specific power line at a utility power substation. A battery or other power source supplies up to 125 volts ac or dc which is converted to a 5 volt dc and a 3 volt dc voltage level. At installation the apparatus is calibrated to sense when the power line being monitored carries a voltage level of 2000 volts or higher. With the power line energized and the apparatus 40 positioned, the potentiometer 106 is varied to define a reference voltage for triggering the digital output (i.e., relay or external receiver software alarm). When the sensor signal goes below the reference voltage comparator circuit 76 drives relay 80 closed so as to initiate isolation of a de-energized line at the substation.

With the apparatus 40 calibrated, normal sensing operation occurs. The exposed sensor wire 43 has a voltage signal induced from the E-field surrounding the power line. Such induced signal is amplified by hex inverters 12 generating an output signal driving photodiode 91. A photodetector senses the photodiode output generating isolator output signal 92. The isolator output signal 92 is output via connections 52, 54 as a 0–3 volt analog output signal 56. The analog output signal 56 is fed to an indicating device, such as a meter or warning light. The analog output signal also is fed to SCADA equipment which converts the output to data for monitoring and controlling the power line. For example a receiver converts the analog output to digital format and compares the voltage level with a programmed reference voltage level. When the output voltage is less than the programmed voltage, an alarm is triggered causing the monitored power line to be isolated (shut down).

The isolator signal 92, in addition to being fed out as the analog output signal 56, is input to comparator circuit 76. Whenever the isolator output signal 92 magnitude goes below the reference voltage magnitude, the comparator circuit 76 turns switching transistor 78 off, and in turn closes relay 80. While the isolator output signal 92 magnitude is greater than the reference voltage magnitude, the comparator circuit 76 keeps the switching transistor 78 on, and thus, keeps the relay 80 open.

While the relay is open, the digital output is an open contact (logic high). When the relay closes, the digital output is a closed contact (logic low). The digital output is accessed across connections 58,60. In one embodiment, the digital output is coupled to motors which open switches to isolate all de-energized power lines at a substation when a digital output from apparatus 40 at a given power substation has a closed contact (logic low). Thus, when the voltage along any power line monitored at the substation goes below a predetermined value, such as 2000 volts, correlated to the reference voltage at the comparator or programmed voltage at a receiver (not shown) the power lines at the substation are isolated.

Concluding Remarks

Although a preferred embodiment of the invention has been illustrated and described, various alternatives, modifications and equivalents may be used. For example, although the apparatus is described in the context of monitoring power lines in a utility power system, the apparatus also may be used to detect energization of high power signal lines in other contexts. Therefore, the foregoing description should not be taken as limiting the scope of the inventions which are defined by the appended claims.

What is claimed is:

1. A non-contact apparatus for sensing activity of a high voltage signal line, comprising:
   a grounded housing for shielding internal circuitry from an E-field of the high voltage signal line;
   a conductive wire protruding from the housing for sensing the E-field, an input signal induced upon the conductive wire from the E-field;
   means for amplifying the input signal to be within a given voltage range to generate an amplified signal;
   means for comparing the amplified signal to a reference signal to generate a control signal.

2. The apparatus of claim 1 in which the reference voltage is programmable.

3. The apparatus of claim 1 further comprising an optical isolation circuit, the amplified signal received into the optical isolation circuit, the optical isolation circuit generating in response an isolation output signal which is input to the comparing means.

4. The apparatus of claim 1 tuned by varying a length of exposed conductive wire protruding from the housing.

5. An apparatus for sensing energization of one of a plurality of power lines at a utility power station, the apparatus positioned adjacent to the one power line without physical contact with the one power line, comprising:
   a grounded housing for shielding internal circuitry from E-fields of the plurality of power lines;
   a conductive wire protruding from the housing for sensing a first E-field of the one power line, an input signal induced upon the conductive wire from the first E-field;
   means for amplifying the input signal within a given voltage range to generate an amplified signal;
   means for comparing the amplified signal to a reference signal to generate a line isolation control signal;
   wherein the line isolation control signal controls shutdown of the one power line; and wherein the amplified signal is an analog output signal for indicating whether the one power line is "energized".

6. The apparatus of claim 5 in which the reference voltage is programmable.

7. The apparatus of claim 5 further comprising an optical isolation circuit, the amplified signal received into the optical isolation circuit, the optical isolation circuit generating in response an isolation output signal which is input to the comparing means.

8. The apparatus of claim 5 tuned by varying the length of exposed conductive wire protruding from the housing.

* * * * *